US012652032B2

(12) United States Patent
Lin

(10) Patent No.: US 12,652,032 B2
(45) Date of Patent: Jun. 9, 2026

(54) SEMICONDUCTOR SYSTEM AND METHOD FOR OPERATING THE SAME

(71) Applicant: TAIWAN SEMICONDUCTOR MANUFACTURING COMPANY LTD., Hsinchu (TW)

(72) Inventor: Wei Shuo Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 37 days.

(21) Appl. No.: 18/747,358

(22) Filed: Jun. 18, 2024

(65) Prior Publication Data

US 2025/0385664 A1 Dec. 18, 2025

(51) Int. Cl.
*H03K 5/156* (2006.01)
*H03K 5/135* (2006.01)

(52) U.S. Cl.
CPC ........... *H03K 5/1565* (2013.01); *H03K 5/135* (2013.01)

(58) Field of Classification Search
None
See application file for complete search history.

(56) References Cited

U.S. PATENT DOCUMENTS 11,742,016 B2 * 8/2023 Yoon ...................... G11C 7/222
365/149

OTHER PUBLICATIONS

Samson Lai; "System, Device, and Method for Transforming a Single-Ended Input Signal Into Differential Output Signals", U.S. Appl. No. 18/612,148, filed Mar. 21, 2024, which disclosure is incorporated by reference in its entirety.

* cited by examiner

*Primary Examiner* — Cassandra F Cox
(74) *Attorney, Agent, or Firm* — WPAT LAW; Anthony King

(57) ABSTRACT

A semiconductor system and a method for operating the semiconductor system are provided. The semiconductor system comprises a duty cycle corrector (DCC) and an analog quadrature error corrector (QEC). The DCC is configured to receive an input clock signal to adjust a duty cycle of the input clock signal and generate a first modified clock signal. The analog QEC is configured to receive the first modified clock signal. The analog QEC is configured to adjust a delay of the first modified clock signal and generate a first output clock signal and a second output clock signal. The second output clock signal delays or advances a quarter of period from the first output clock signal. The analog QEC comprises a first inverter chain, a phase error detector (PED) and a first low-pass filter (LPF).

20 Claims, 17 Drawing Sheets

SEMICONDUCTOR SYSTEM AND METHOD FOR OPERATING THE SAME

BACKGROUND

The present disclosure relates, in general, to semiconductor systems and methods for operating the same. Specifically, the present disclosure relates to semiconductor systems and methods for operating semiconductor products with quadrature phases.

As system clock speeds continue to rise, signal reliability and accuracy have become increasingly important, particularly with respect to amplitude, frequency, and distortion. Clock signals with multiple phases are widely utilized to facilitate stable operations of the semiconductor systems, which may increase routing areas and deteriorate phase accuracy.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1A:
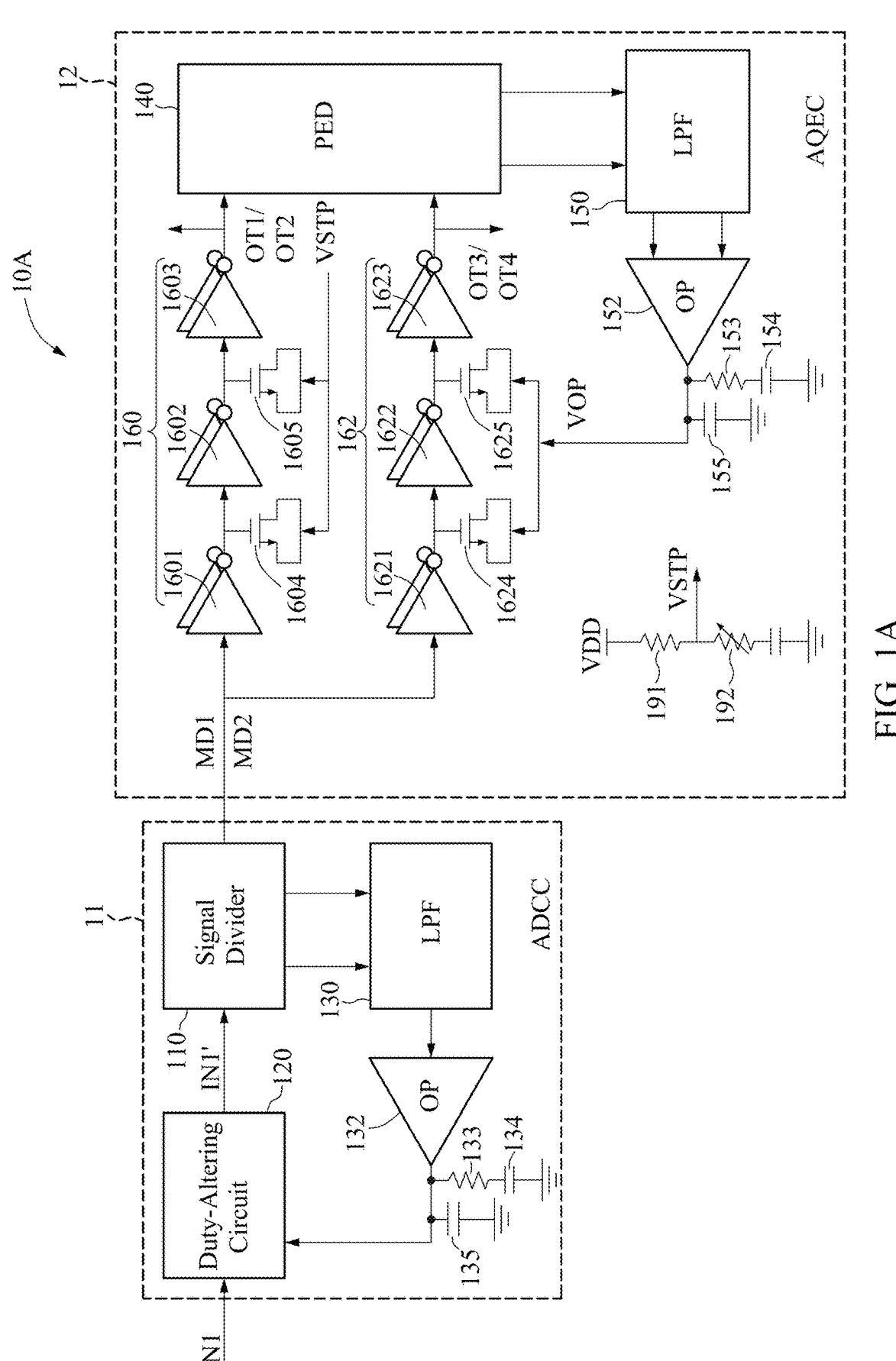
FIG. 1A is a schematic view of a semiconductor system having an analog duty cycle corrector (ADCC) and an analog quadrature error corrector (AQEC), in accordance with some embodiments of the present disclosure.

The following disclosure provides different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90° or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A semiconductor system with a single to quadrature phase generator is provided by the present disclosure to receive one input signal and generates four output clock signals with phase difference of 90°. The proposed semiconductor system can include a duty cycle corrector (DCC) for adjusting the duty cycle and a quadrature error corrector (QEC) for controlling the phases to delay or advance the signals. The DCC and QEC can be manufactured digitally or analogically based on needs to reduce the area of the semiconductor system and other external circuits. In addition, a feedback path from the output signal to the DCC can be provided to reduce signal distortion and improve the phase accuracy.

FIG. 1A is a schematic view of a semiconductor system 10A in accordance with some embodiments of the present disclosure. The semiconductor system 10A can include any suitable circuit type, including processing devices, memory input/output interfaces, and high-frequency data converters. Exemplary processing devices include, but are not limited to, a central processing unit, a microprocessor, and a digital signal processor. The semiconductor system 10A includes an analog duty cycle corrector (ADCC) 11 and an analog quadrature error corrector (AQEC) 12.

The semiconductor system 10A can be used to receive a signal IN1 and generate four signals OT1, OT2, OT3 and OT4 having different phases. The signal IN1 can include an input clock signal. Each of the four signals OT1, OT2, OT3 and OT4 can include an output clock signal. The four signals OT1, OT2, OT3 and OT4 can have quadrature phases. In some embodiments, the signal IN1 can have a phase of 0° or 180°. The signal OT1 can have a phase of 0°. The signal OT2 can have a phase of 180°. The signal OT3 can have a phase of 90°. The signal OT4 can have a phase of 270°.

The ADCC 11 includes a signal divider 110, a duty-altering circuit 120, a low-pass filter 130 and an operational amplifier (OP) 132. The ADCC 11 may be utilizing in applications involving multiphase clocks, MUX/DEMUX circuits, or other circuits with fixed rising edge requirements. In some embodiments, the duty-altering circuit 120 can receive the signal IN1 from an external clock or circuit. The signal IN1 can include an input clock signal. The duty-altering circuit 120 adjusts a duty cycle of the signal IN1 and generates a signal IN1' having an altered duty cycle.

The signal divider 110 can be electrically connected between the duty-altering circuit 120 and the low-pass filter (LPF) 130. The signal divider 110 can include a signal-to-differential generator (S2D). The signal divider 110 can include a low distortion signal-to-differential generator (LDS2D). The signal divider 110 is configured to receive the signal IN1' with altered duty cycle from the duty-altering circuit 120 and generate two signals MD1 and MD2. The signals MD1 and MD2 can include two different modified clock signals. The signal MD2 delays or advances half a period from the signal MD1. The signal MD1 can have a phase of 0°, and the signal MD2 can have a phase of 180°. In some embodiments, the LPF 130 can be electrically connected between the signal divider 110 and the OP 132. The OP 132 can be electrically connected between the LPF 130 and the duty-altering circuit 120. A resistor 133 and two capacitors 134 and 135 can be arranged between the duty-altering circuit 120 and the OP 132.

The AQEC 12 can include a phase error detector (PED) 140, an LPF 150, an OP 152, and two inverter chains 160 and 162. Inverter chain 160 includes a plurality of inverters 1601, 1602 and 1603, and several transistors 1604 and 1605. Each of the transistors 1604 and 1605 can include a capacitor with the drain region electrically connected to the source region. Source/drain region(s) may refer to a source or a drain, individually or collectively dependent upon the context. The inverter chain 162 includes a plurality of inverters 1621, 1622 and 1623, and several transistors 1624 and 1625. Each of the transistors 1624 and 1625 can include a capacitor with the drain region electrically connected to the source region.

The inverter chain 160 receives the signals MD1 and MD2 and generates signals OT1 and OT2 accordingly in response to the voltage VSTP. The inverter chain 162 receives the signals MD1 and MD2 and generates signals OT3 and OT4 accordingly in response to the voltage VOP. The PED 140 is electrically connected between the LPF 150 and the inverter chains 160 and 162. The PED 140 is configured to receive the signals OT1 to OT4 and adjust the phases of the signals OT1 to OT4. The LPF 150 is electrically connected between the PED 140 and the OP 152. The LPF 150 can be used to filter the signals OT1 to OT4 having the adjusted phase. As shown in FIG. 1A, the resistor 153 and the capacitors 154 and 155 can be formed between the OP 152 and the inverter chain 162. The OP 152 receives the filtered signals OT1 to OT4 having the adjusted phase. The voltage VOP at the output of the OP 152 is transmitted to the transistors 1624 and 1625 for controlling the inverter chain 162.

Regarding the inverter chain 162, the transistors 1624 and 1625 are operable in response to the voltage VOP. The transistor 1624 is electrically connected between the adjacent inverters 1621 and 1622. The transistor 1625 is electrically connected between the adjacent inverters 1622 and 1623. Regarding the inverter chain 160, the transistors 1604 and 1605 are operable in response to the voltage VSTP. The voltage VSTP can be obtained at the node between two resistors 191 and 192 electrically connected in series between the voltage source VDD and the ground. The resistance value of the resistor 192 is adjustable, and the resistance value of the resistor 191 is fixed. The transistor 1604 is electrically connected between the adjacent inverters 1601 and 1602. The transistor 1605 is electrically connected between the adjacent inverters 1602 and 1603.

By utilizing the semiconductor system 10A of FIG. 1A, the signals OT3 and OT4 can be adjusted or generated in response to the signals OT1 and OT2. In some embodiments, the signal OT3 delays or advances a quarter of period from the signal OT1. The semiconductor system 10A can include a single to quadrature phase generator because it receives one signal IN1 and generates four signals OT1 to OT4 with phase difference of 90°. Because merely one signal IN1 is received by the semiconductor system 10A, the number of phase interpolators (PIs) for trimming or adjusting the phases of signals can be reduced. The PI can be provided in a delay clock loop (DLL) circuit and electrically connected to the ADCC 11 for transmitting the signal IN1. In addition, both the ADCC 11 and the AQEC 12 can be implemented by analog circuits or analog electronic components, the area of the ADCC 11 and the AQEC 12 can be reduced without arranging a finite state machine (FSM) in the semiconductor system 10A for processing digital signals.

Figure 1B:
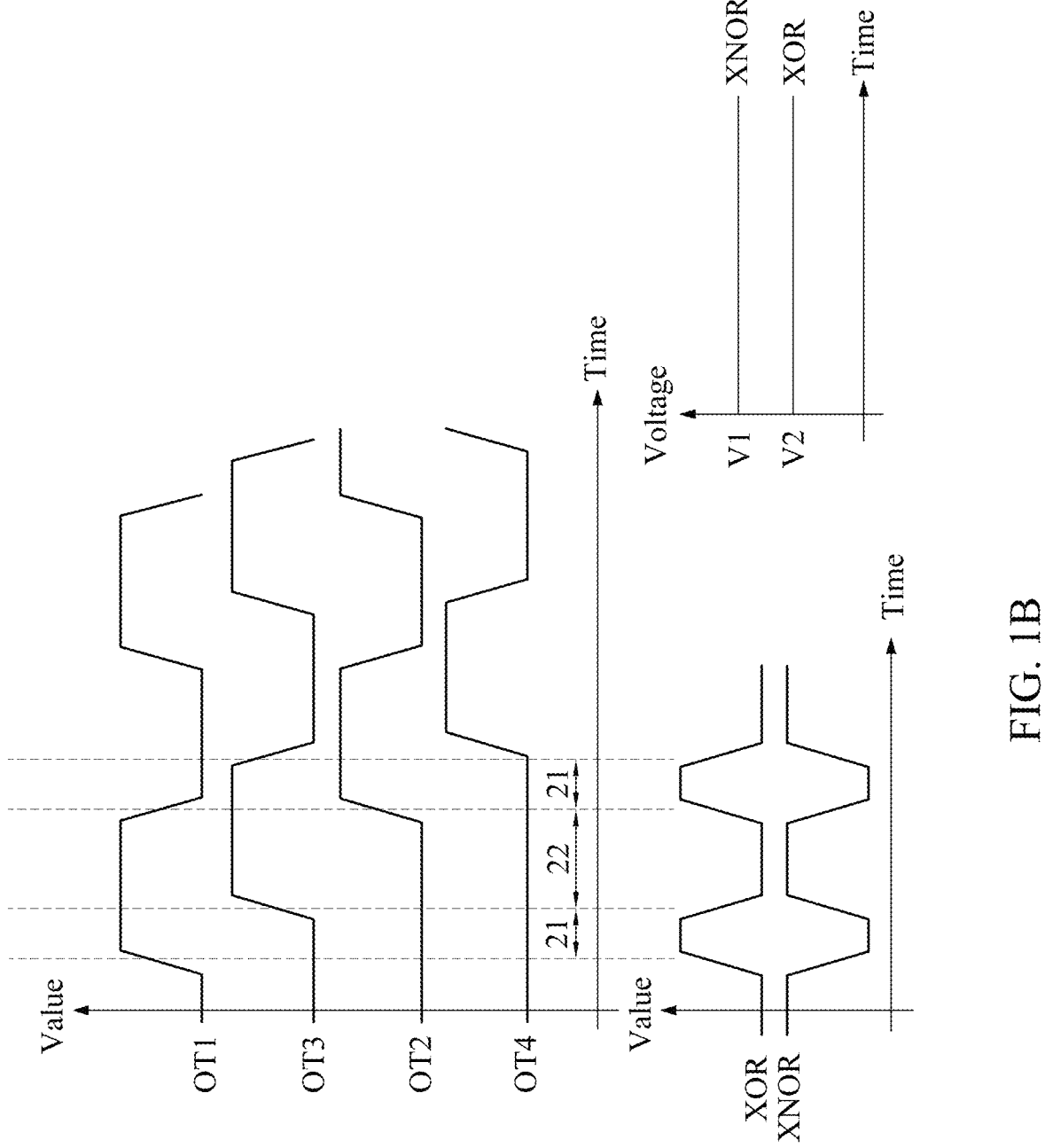
FIG. 1B includes schematic diagrams illustrating signal waveforms of a phase error detector (PED) of the AQEC, in accordance with some embodiments of the present disclosure.

FIG. 1B includes schematic diagrams illustrating signal waveforms of the PED 140 of the AQEC 12, in accordance with some embodiments of the present disclosure. The signals OT1, OT2, OT3 and OT4 are received by the PED 140. The signals OT1, OT2, OT3 and OT4 can have phases of 0°, 180°, 90° and 270° respectively. As shown in FIG. 1B, the signals OT1 and OT2 are fully differential, which means that the signal OT1 is at high value when the signal OT2 is at low value, and vice versa. The signals OT3 and OT4 are fully differential, which means that the signal OT3 is at high value when the signal OT4 is at low value, and vice versa. The phases of the signals OT3 and OT4 can be adjusted by the PED 140 in response to the signals OT1 and OT2.

In some embodiments, the PED 140 performs the XOR (exclusive OR) operation on the signals OT1 and OT3, and performs the XNOR (exclusive NOR) operation on the signals OT2 and OT4. In the time zone 21, the XOR operation is at high value and the XNOR operation is at low value. In the time zone 22, the XOR operation is at low value and the XNOR operation is at high value. In some embodiments, the PED 140 extracts and obtains the DC values of the XOR operation and the XNOR operation by utilizing resistors and capacitors as a low-pass filter (LPF). The XNOR operation corresponds to the voltage value V1, and the XOR operation corresponds to the voltage value V2. The voltage value V1 is greater than the voltage value V2, and thus the delay of the signal OT3 can be increased. In some embodiments, the voltage value V1 is smaller than the voltage value V2, and the delay of the signal OT3 can be decreased.

Figure 1C:
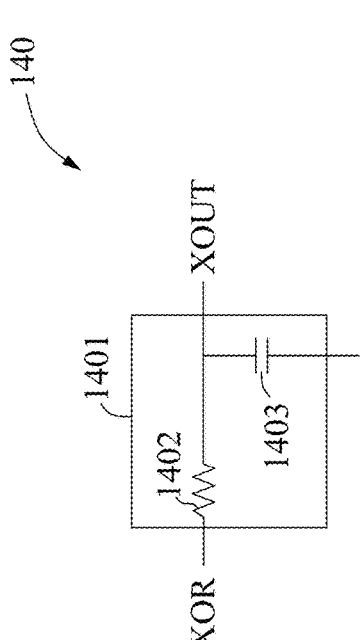
FIG. 1C is a schematic view of the PED of the AQEC, in accordance with some embodiments of the present disclosure.
Figure 1C:
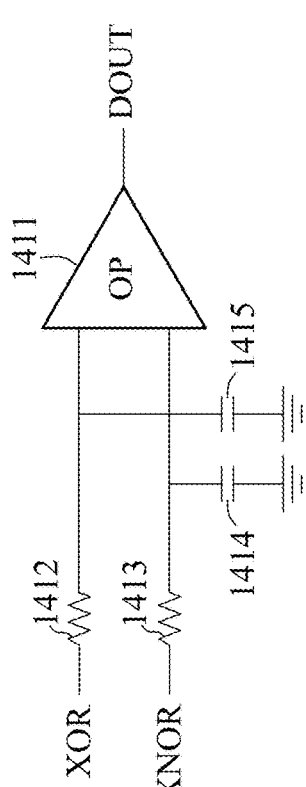

FIG. 1C is a schematic view of the PED 140 of the AQEC 12, in accordance with some embodiments of the present disclosure. The PED 140 can include an LPF 1401, an OP 1411, the resistors 1412, 1413, and the capacitors 1414, and 1415. The LPF 1401 includes a resistor 1413 and a capacitor 1414. The LPF 1401 can receive the value of the XOR operation and obtain the signal XOUT corresponding to the DC value of the XOR operation. The LPF 1401 can also receive the value of the XNOR operation and obtain the signal XOUT corresponding to the DC value of the XNOR operation.

In some embodiments, the OP 1411 compares the values of the XOR operation and the XNOR operation. The OP 1411 can compare the values of the XOR operation and the XNOR operation and generate the DOUT signal accordingly. The DOUT signal can be feed backed or transmitted to the inverter chain 162 for increasing or decreasing delays of the signals OT3 and OT4. The phases of the signals OT3 and OT4 can be adjusted in response to the DOUT signal.

Figure 1D:
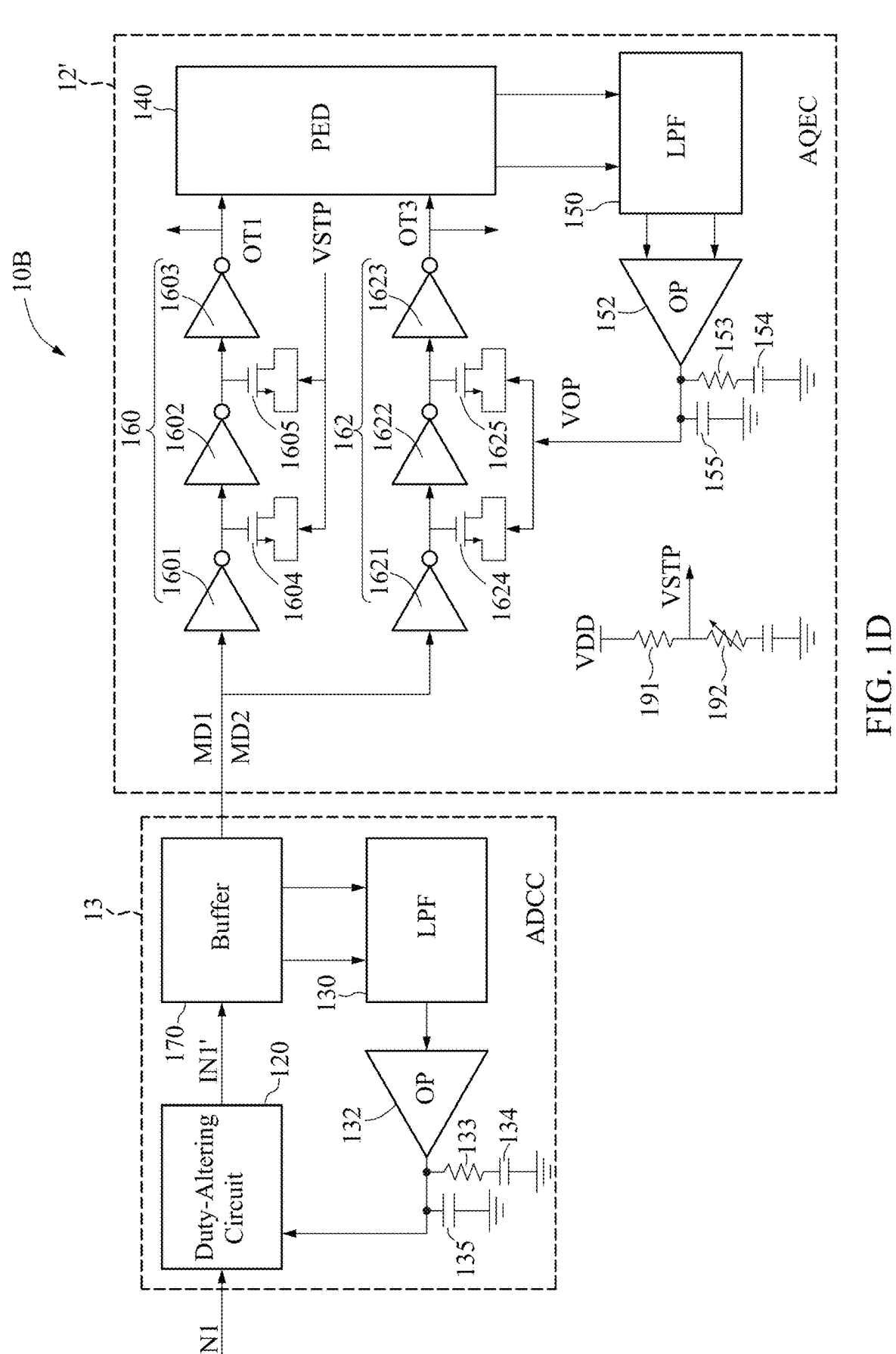
FIG. 1D is a schematic view of another semiconductor system having an ADCC and an AQEC, in accordance with some embodiments of the present disclosure.

FIG. 1D is a schematic view of another semiconductor system 10B having an ADCC 13 and an AQEC 12', in accordance with some embodiments of the present disclosure. The semiconductor system 10B of FIG. 1D is similar to the semiconductor system 10A of FIG. 1A, differing only as follows.

The semiconductor system 10A of FIG. 1A can belong to a quadrature data system (QDR). The signal with 24 G bps (bit per second) can be sampled or processed by the semiconductor system 10A by utilizing the clock signal of 6 G bps with 4 phases, which corresponds to the signals OT1, OT2, OT3 and OT4. The semiconductor system 10B of FIG. 1D can belong to a double data system (DDR). The signal with 24 G bps (bit per second) can be sampled or processed by the semiconductor system 10B by utilizing the clock signal of 12 G bps with 2 phases, which corresponds to the signals OT1 and OT3.

The semiconductor system 10B includes an ADCC 13 and an AQEC 12'. The ADCC 13 of FIG. 1D is similar to the ADCC 12 of FIG. 1A, with the signal divider 110 of FIG. 11 is replaced with the buffer 170. The buffer 170 can include at least one buffering circuit. In some embodiments, the buffer 170 is electrically connected between the duty-altering circuit 120 and the LPF 130. The duty-altering circuit 120 can modify or adjust a duty cycle of the signal IN1 and generate the signal IN1' with altered duty cycle. The buffer 170 is configured to receive the signal IN1' with altered duty cycle and generate the signal MD1. In some embodiments, the ADCC 12 of FIG. 1D receives the signal IN1 and generates one signal MD1. The ADCC 11 of FIG. 1A receives the signal IN1 and generates two signals MD1 and MD2. Compared to the semiconductor system 10A of FIG. 1A, more PIs can be reduced for the semiconductor system 10B of FIG. 1D.

Figure 1E:
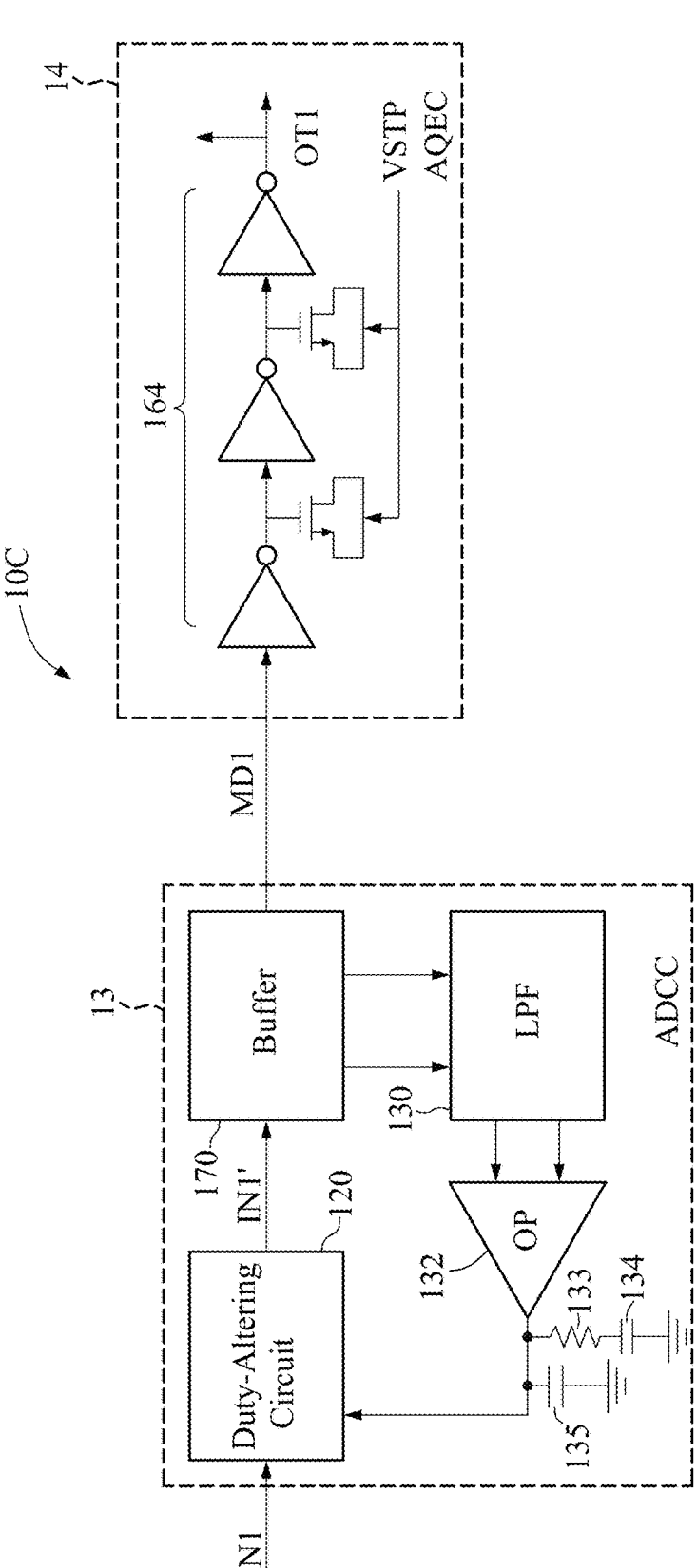
FIG. 1E is a schematic view of another semiconductor system having an ADCC and an AQEC, in accordance with some embodiments of the present disclosure.

FIG. 1E is a schematic view of another semiconductor system 10C having an ADCC 13 and an AQEC 14, in accordance with some embodiments of the present disclosure. The semiconductor system 10C of FIG. 1E is similar to the semiconductor system 10B of FIG. 1D, differing only as follows.

The semiconductor system 10C includes an ADCC 13 and an AQEC 14. The AQEC 14 of FIG. 1E is similar to the AQEC 12 of FIG. 1D, with the inverter chain 162, the PED 140, the LPF 150, the capacitors 153, 154, and the resistor 153 omitted. The AQEC 14 includes single inverter chain 164 for receiving the signal MD1 and generating the signal OT1. The semiconductor system 10C of FIG. 1E can correspond to a data lane for processing data signals. The semiconductor system 10B of FIG. 1D can correspond to a clock lane for processing clock signals.

Figure 2:
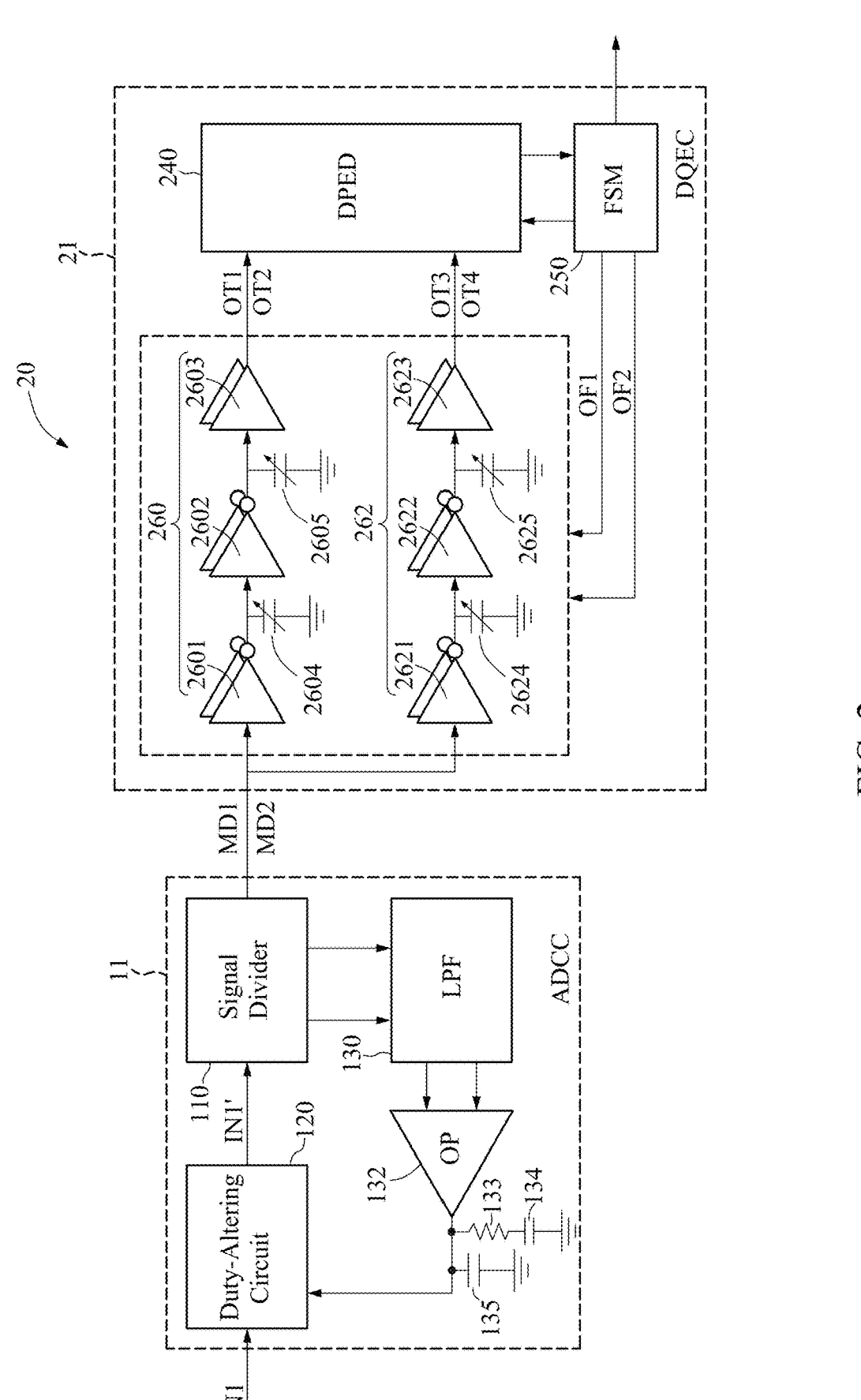
FIG. 2 is a schematic view of a semiconductor system having an ADCC and a digital quadrature error corrector (DQEC), in accordance with some embodiments of the present disclosure.

FIG. 2 is a schematic view of a semiconductor system 20 having an ADCC 11 and a digital quadrature error corrector (DQEC) 21, in accordance with some embodiments of the present disclosure. The semiconductor system 20 of FIG. 2 is similar to the semiconductor system 10A of FIG. 1A, differing only as follows.

The semiconductor system 20 includes the ADCC 11 and the DQEC 21. The DQEC 21 can include the inverter chains 260 and 262, the digital phase error detector (DPED) 240 and the FSM 250. The inverter chain 260 includes a plurality of inverters 2601, 2602 and 2603, and a plurality of capacitors 2604 and 2605. The inverter chain 262 includes a plurality of inverters 2621, 2622 and 2623, and a plurality of capacitors 2624 and 2625. The capacitance values of the capacitors 2604, 2605, 2624, and 2625 are adjustable in response to the output signals OF1 and OF2 of the FSM 250.

The inverter chain 260 receives the signals MD1 and MD2 and generate the signals OT1 and OT2 accordingly in response to the output signals of the FSM 250. The inverter chain 262 receives the signals MD1 and MD2 and generate the signals OT3 and OT4 accordingly in response to the output signals of the FSM 250. The DPED 240 is electrically connected between the FSM 250 and the inverter chains 260 and 262. The DPED 240 is configured to receive the signals OT1 to OT4 and adjust the phases of the signals OT1 to OT4. The FSM 250 is electrically connected between the DPED 240 and the inverter chains 260 and 262. The FSM 250 can be used to moderate or process the signals OT1 to OT4 having the adjusted phase. The FSM 250 can receive the signals OT1 to OT4 having the adjusted phase. The output signals OF1 and OF2 of the FSM 250 is transmitted to the inverter chains 260 and 262 for controlling the inverter chains 260 and 262.

Figure 3:
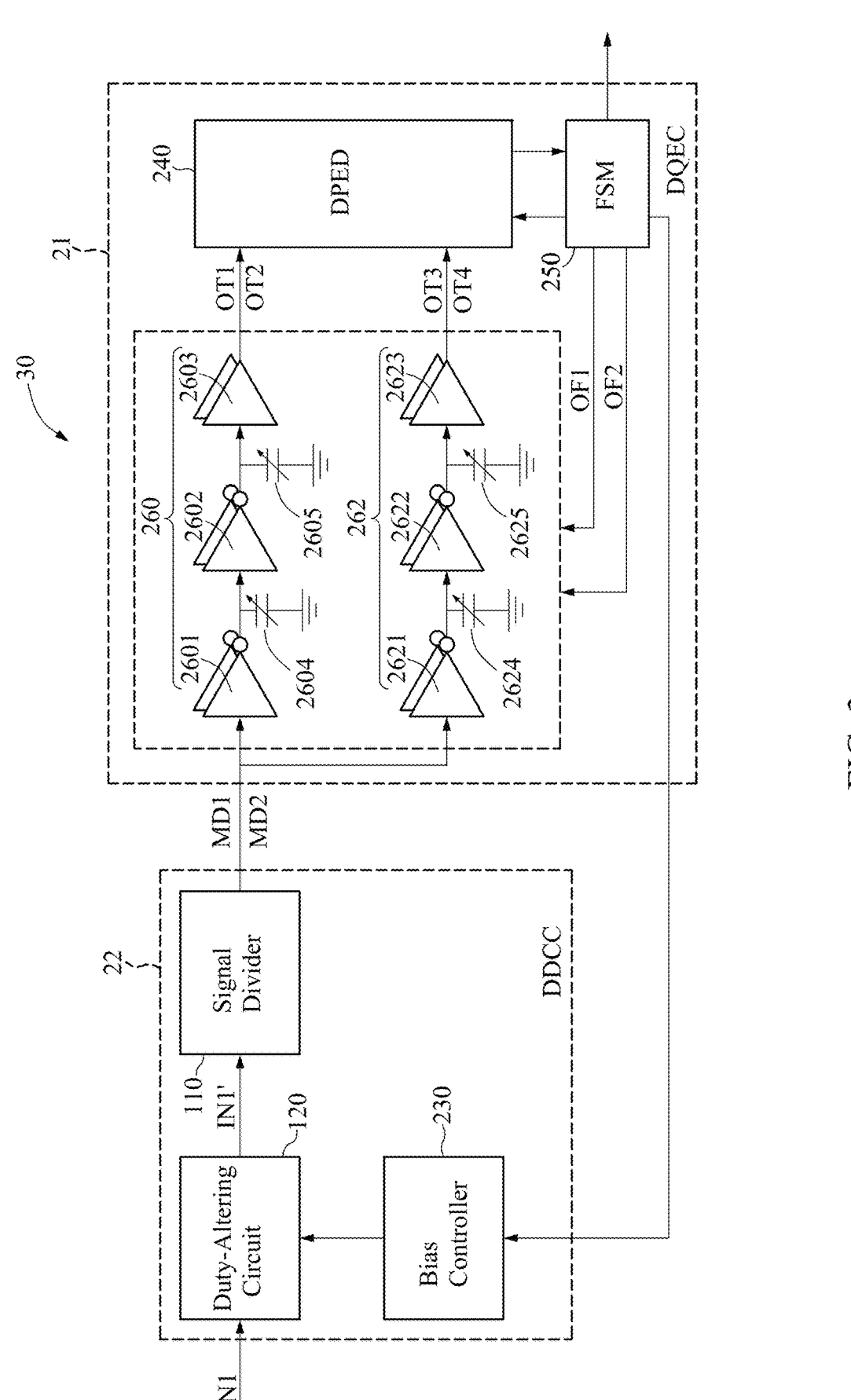
FIG. 3 is a schematic view of a semiconductor system having a digital duty cycle corrector (DDCC) and a DQEC, in accordance with some embodiments of the present disclosure.

FIG. 3 is a schematic view of a semiconductor system 30 having a DDCC 22 and a DQEC 21, in accordance with some embodiments of the present disclosure. The semiconductor system 30 of FIG. 3 is similar to the semiconductor system 20 of FIG. 2, differing only as follows.

The semiconductor system 30 includes the DDCC 22 and the DQEC 21. The DDCC 22 includes a signal divider 110, a duty-altering circuit 120, and a bias controller 230. In some embodiments, the duty-altering circuit 120 can receive the signal IN1 from an external clock or circuit. The signal IN1 can include an input clock signal. The duty-altering circuit 120 adjusts a duty cycle of the signal IN1 and generate the signal IN1' with altered duty cycle.

The signal divider 110 can be electrically connected between the duty-altering circuit 120 and the bias controller 230. The signal divider 110 can include a signal-to-differential generator (S2D). The signal divider 110 can include a low distortion signal-to-differential generator (LDS2D). The signal divider 110 is configured to receive the signal IN1' with altered duty cycle from the duty-altering circuit 120 and generate two signals MD1 and MD2 to the DQEC 21. The signals MD1 and MD2 can include two different modified clock signals. The signal MD2 delays or advances half of period from the signal MD1. The signal MD1 can have a phase of 0°, and the signal MD2 can have a phase of 180°. The bias controller 230 can be electrically connected between the duty-altering circuit 120 and the FSM 250 of the DQEC 21. In some embodiments, the semiconductor system 30 including the DDCC 22 and the DQEC 21 is all digital. The FSM 250 can be shared with the DDCC 22 and the DQEC 21 to minimize the area of the semiconductor system 30.

Figure 4:
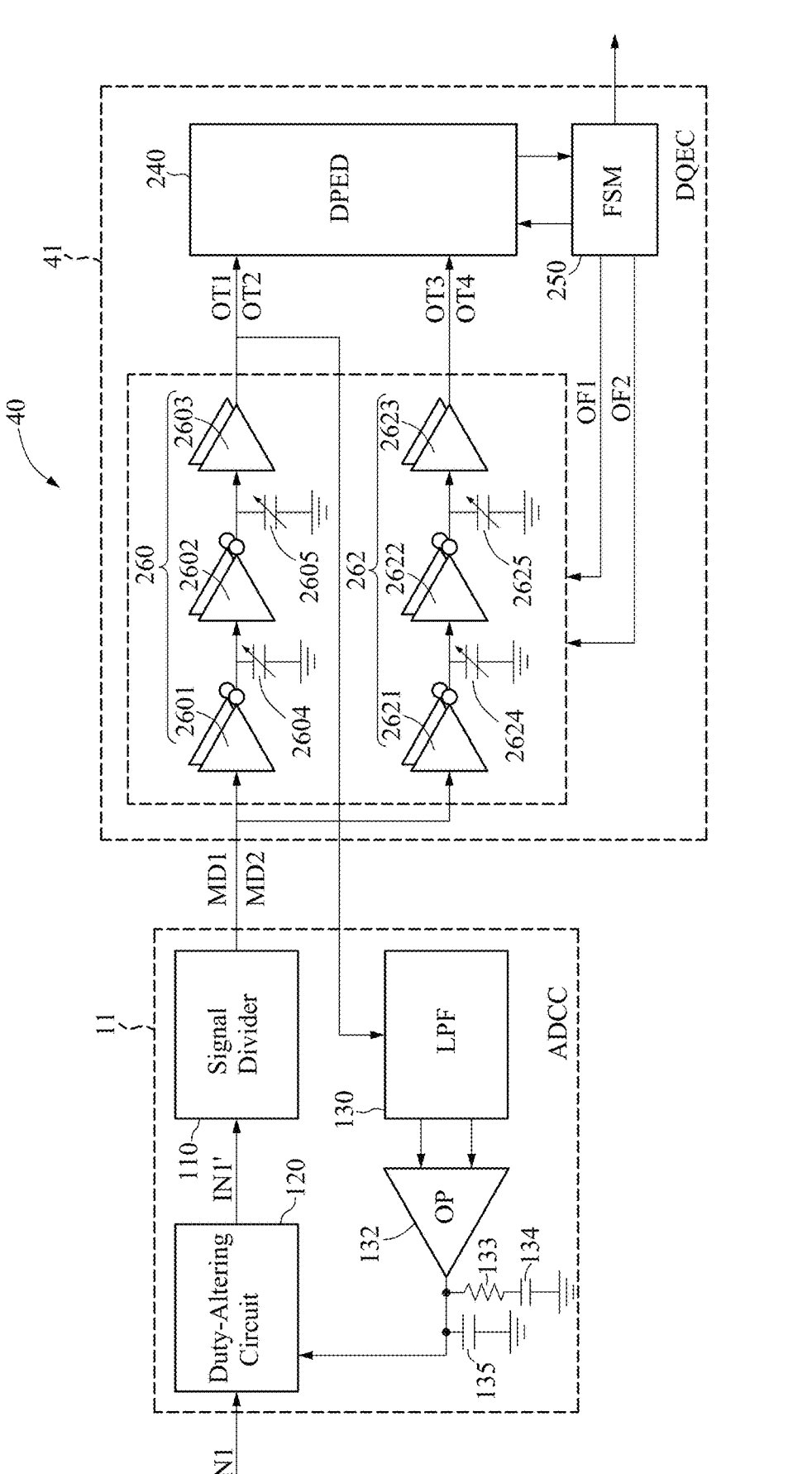
FIG. 4 is a schematic view of a semiconductor system having an ADCC and a DQEC, in accordance with some embodiments of the present disclosure.

FIG. 4 is a schematic view of a semiconductor system 40 having an ADCC 11 and a DQEC 41, in accordance with some embodiments of the present disclosure. The semiconductor system 40 of FIG. 4 is similar to the semiconductor system 20 of FIG. 2, differing only as follows.

The semiconductor system 30 includes the DDCC 22 and the DQEC 41. The DQEC 41 can include the inverter chains 260 and 262, the digital phase error detector (DPED) 240 and the FSM 250. In some embodiments, the signals OT1 and OT2 are transmitted to the DPED 240 and the LPF 130 of the ADCC 11. Because the signals OT1 and OT2 can be directly transmitted to the LPF 130 of the ADCC 11, the signal distortion can be reduced, and the phase accuracy is improved.

Figure 5A:
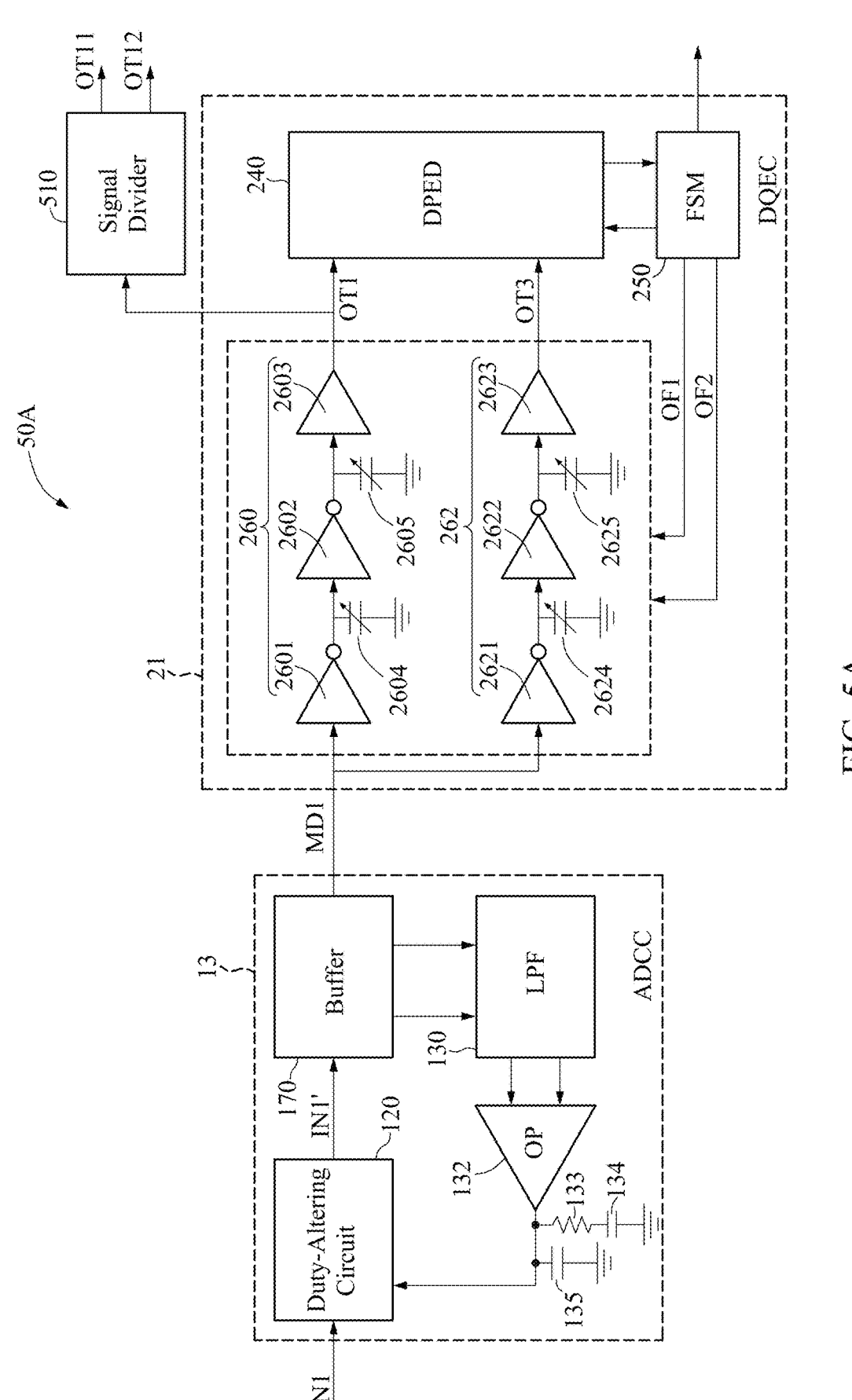
FIG. 5A is a schematic view of a semiconductor system having an ADCC and a DQEC, in accordance with some embodiments of the present disclosure.

FIG. 5A is a schematic view of a semiconductor system 50A having an ADCC 13 and a DQEC 21, in accordance with some embodiments of the present disclosure. The semiconductor system 50A of FIG. 5A is similar to the semiconductor system 10B of FIG. 1D and the semiconductor system 20 of FIG. 2, differing only as follows.

The semiconductor system 50A includes the ADCC 13, the DQEC 21, and another signal divider 510. The signal divider 510 is similar to the signal divider 110 of FIG. 1A. The signal divider 510 can be electrically connected to the DQEC 21. The signal divider 510 can be electrically connected to the inverter chain 260 and the DPED 240 of the DQEC 21. The signal OT1 from the inverter chain 260 can be transmitted both to the DPED 240 and the signal divider

510. The signal divider 510 can be used to receive the signal OT1 and generate two signals OT11 and OT12 accordingly. The signals OT11 and OT12 can be fully differential. The signal OT11 can have phase of 0°, and the signal OT12 can have a phase of 180°. The signal OT11 can delay or advance half of period from the signal OT12. The signal OT12 can delay or advance half of period from the signal OT11. The signal OT12 having the phase of 180° is generated digitally to avoid IR drop or voltage loss from signal transmission. The signals OT11 and OT12 are generated at final stage without passing through other electronic component, and thus the signal distortion is improved.

Figure 5B:
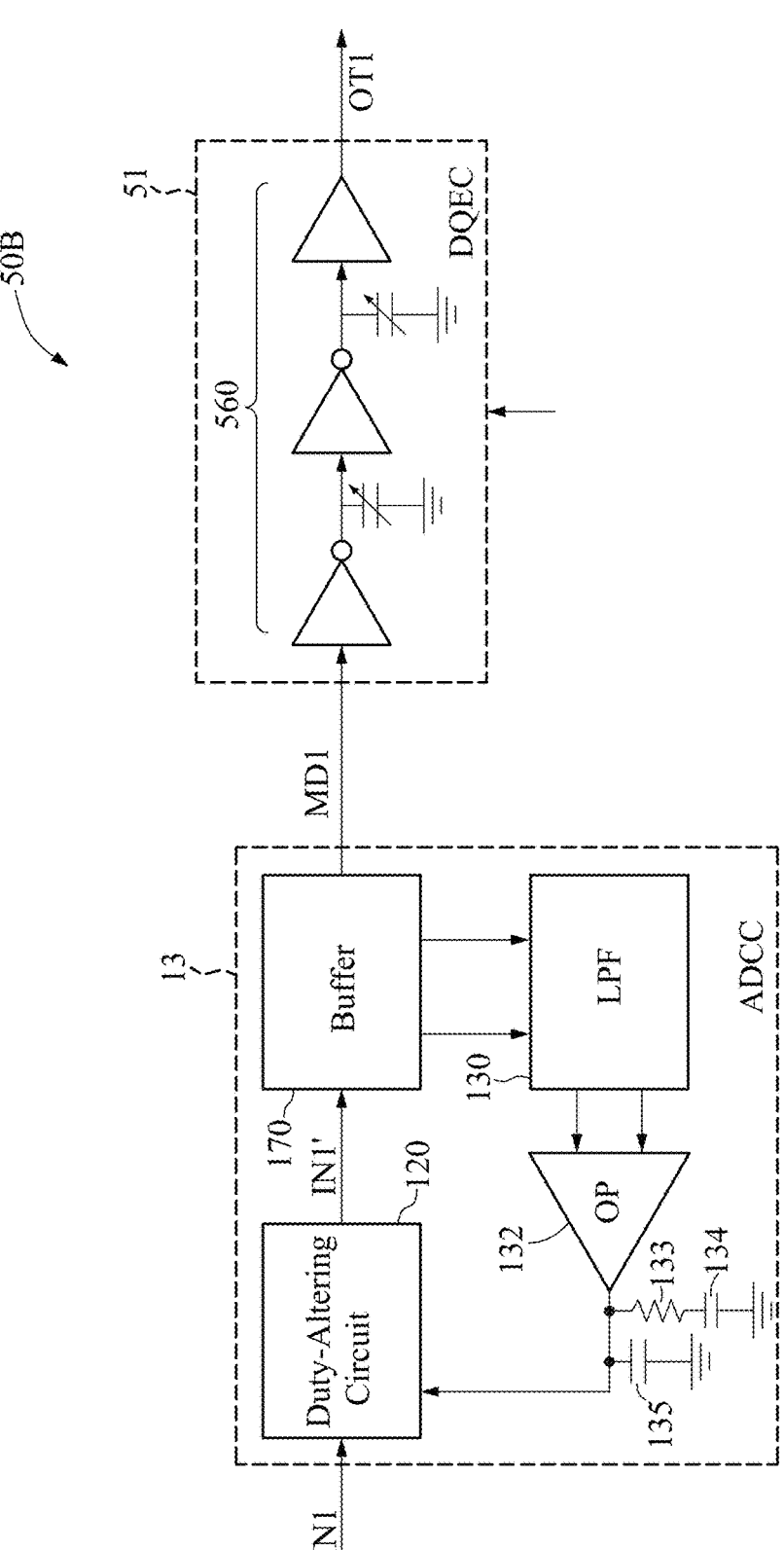
FIG. 5B is a schematic view of another semiconductor system having an ADCC and a DQEC, in accordance with some embodiments of the present disclosure.

FIG. 5B is a schematic view of another semiconductor system 50B having an ADCC 13 and a DQEC 51, in accordance with some embodiments of the present disclosure. The semiconductor system 50B of FIG. 5B is similar to the semiconductor system 50A of FIG. 5A, differing only as follows.

The semiconductor system 50B includes the ADCC 13 and the DQEC 51. The DQEC 51 of FIG. 5B is similar to the DQEC 21 of FIG. 5A, with the inverter chain 262, the DPED 240, and the FSM 250 omitted. The DQEC 21 includes single inverter chain 560 for receiving the signal MD1 and generating the signal OT1. The semiconductor system 50B of FIG. 5B can correspond to a data lane for processing data signals. The semiconductor system 50A of FIG. 5A can correspond to a clock lane for processing clock signals.

Figure 6A:
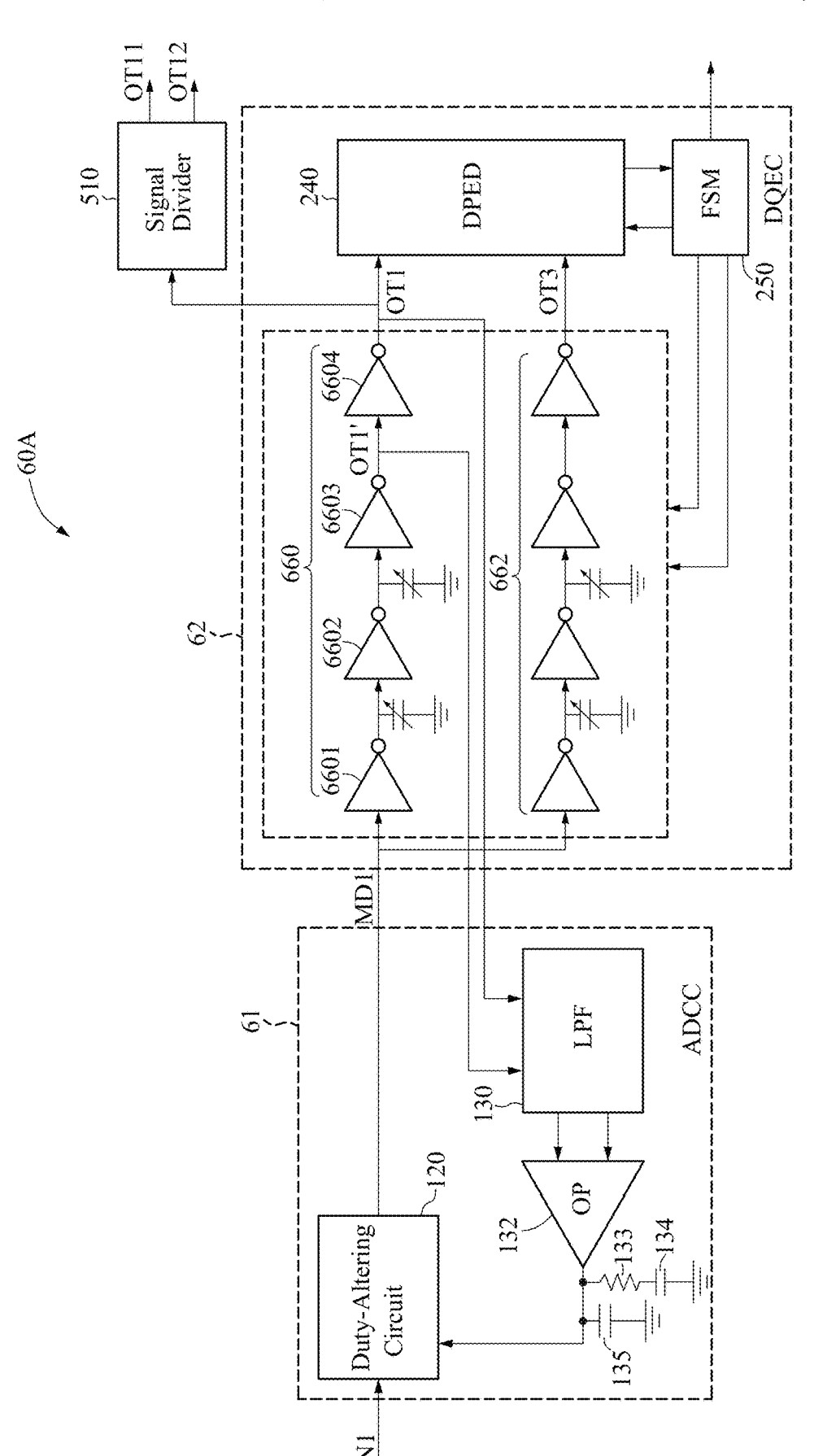
FIG. 6A is a schematic view of a semiconductor system having an ADCC and a DQEC, in accordance with some embodiments of the present disclosure.

FIG. 6A is a schematic view of a semiconductor system 60A having an ADCC 61 and a DQEC 62, in accordance with some embodiments of the present disclosure. The semiconductor system 60A of FIG. 6A is similar to the semiconductor system 40 of FIG. 4 and the semiconductor system 50A of FIG. 5A, differing only as follows.

The semiconductor system 60A includes an ADCC 61, a DQEC 62, and a signal divider 510. The signal divider 510 can be electrically connected to the inverter chain 660 and the DPED 240 of the DQEC 62. The signal OT1 from the inverter chain 660 can be transmitted both to the DPED 240 and the signal divider 510. The signal divider 510 can be used to receive the signal OT1 and generate two signals OT11 and OT12 accordingly. The signals OT11 and OT12 can be fully differential. The signal OT11 can have phase of 0°, and the signal OT12 can have a phase of 180°. The signal OT12 having the phase of 180° is generated digitally to avoid IR drop or voltage loss from signal transmission. The signals OT11 and OT12 are generated at final stage without passing through other electronic component, and thus the signal distortion is improved.

As shown in FIG. 6A, the DQEC 62 include two inverter chains 660 and 662, and each of the inverter chains 660 and 662 includes four inverters. For example, the inverter chain 660 can include four inverters 6601, 6602, 6603 and 6604. The inverter 6604 can be the last inverter of the inverter chain 660 to provide the signal OT1. The inverter 6603 can be formed as a previous stage of the inverter 6604. The inverter 6603 can be the second-to-last inverter of the inverter chain 660 for providing the signal OT1' to the inverter 6604. The signal OT1 can include an output clock signal, and the signal OT1' can include a pre-output clock signal. The signal OT1' can delay or advance half of period from the signal OT1.

In some embodiments, the signal OT1' can be transmitted to the LPF 130 of the ADCC 61. The signal OT1 can be transmitted to the LPF 130 of the ADCC 61, the DPED 240 of the DQEC 62, and the signal divider 510. Because the signals OT1 and OT1' can be directly transmitted to the LPF 130 of the ADCC 61, the signal distortion can be reduced, and the phase accuracy is improved. Furthermore, the signal OT12 having the phase of 180° is generated digitally to avoid IR drop or voltage loss from signal transmission. The signals OT11 and OT12 are generated at final stage without passing through other electronic component, and thus the signal distortion is improved.

Figure 6B:
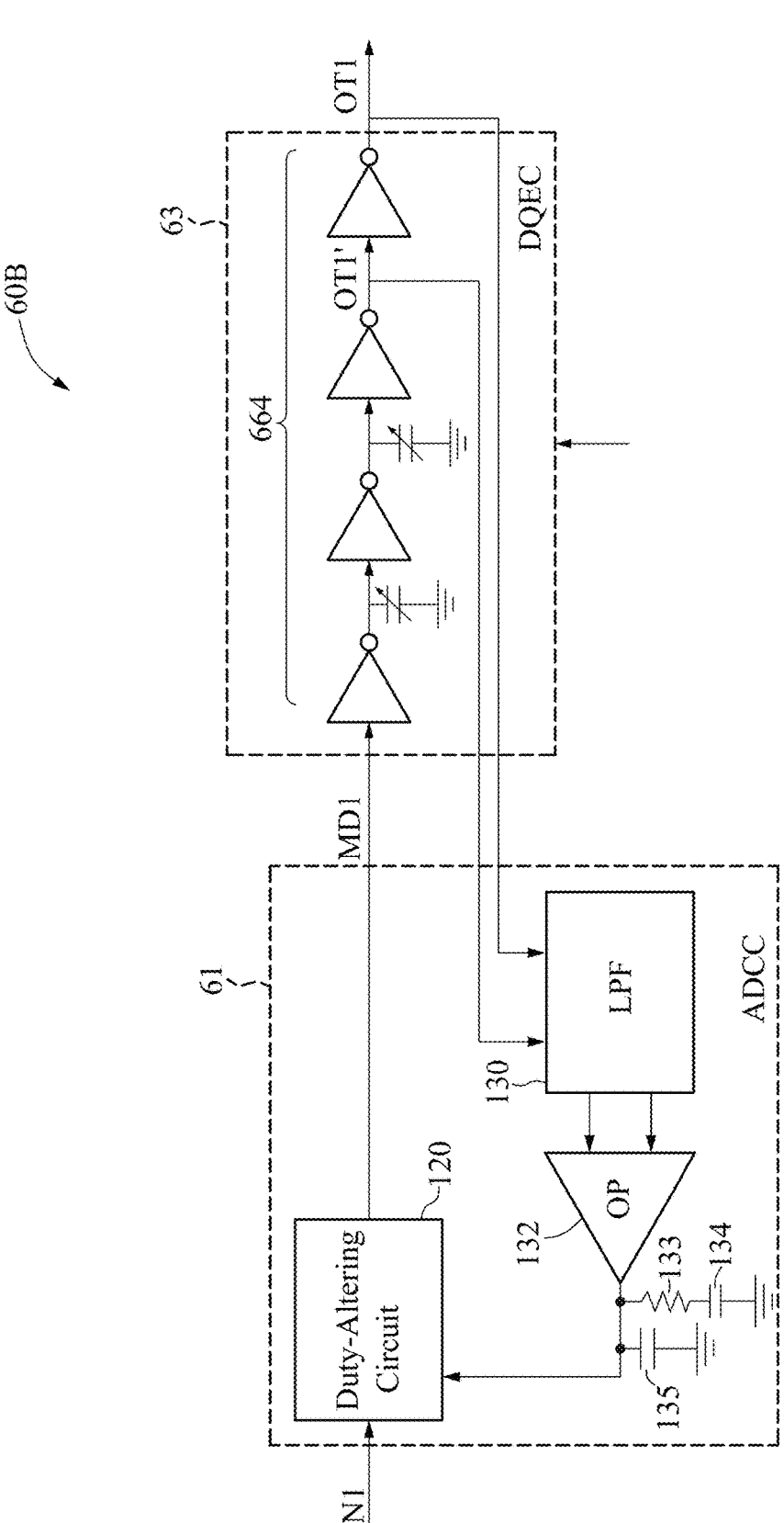
FIG. 6B is a schematic view of another semiconductor system having an ADCC and a DQEC, in accordance with some embodiments of the present disclosure.

FIG. 6B is a schematic view of another semiconductor system 60B having an ADCC 61 and a DQEC 63, in accordance with some embodiments of the present disclosure. The semiconductor system 50B of FIG. 5B is similar to the semiconductor system 50A of FIG. 5A, differing only as follows.

The semiconductor system 60B includes the ADCC 61 and the DQEC 63. The DQEC 63 of FIG. 6B is similar to the DQEC 62 of FIG. 6A, with the inverter chain 662, the DPED 240, and the FSM 250 omitted. The DQEC 63 includes single inverter chain 664 for receiving the signal MD1 and generating the signal OT1. The semiconductor system 60B of FIG. 6B can correspond to a data lane for processing data signals. The semiconductor system 60A of FIG. 6A can correspond to a clock lane for processing clock signals.

Figure 7A:
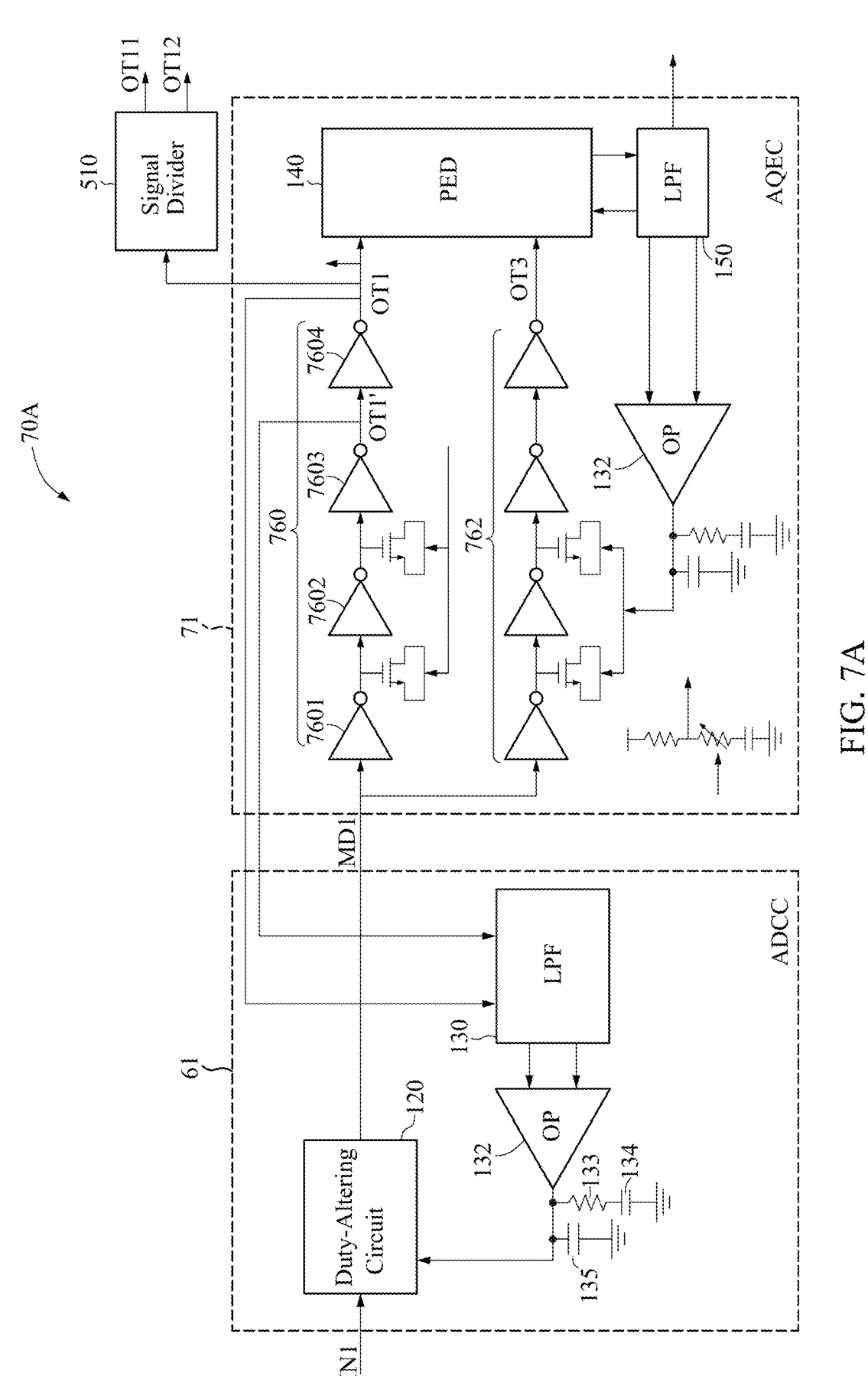
FIG. 7A is a schematic view of a semiconductor system having an ADCC and an AQEC, in accordance with some embodiments of the present disclosure.

FIG. 7A is a schematic view of a semiconductor system 70A having an ADCC 61 and an AQEC 71, in accordance with some embodiments of the present disclosure. The semiconductor system 70A of FIG. 7A is similar to the semiconductor system 60A of FIG. 6A, differing only as follows.

The semiconductor system 70A includes an ADCC 61, an AQEC 71, and a signal divider 510. The signal divider 510 can be electrically connected to the inverter chain 760 and the PED 140 of the AQEC 71. The signal OT1 from the inverter chain 760 can be transmitted both to the PED 140 and the signal divider 510. The signal divider 510 can be used to receive the signal OT1 and generate two signals OT11 and OT12 accordingly. The signals OT11 and OT12 can be fully differential. The signal OT11 can have phase of 0°, and the signal OT12 can have a phase of 180°. The signal OT12 having the phase of 180° is generated digitally to avoid IR drop or voltage loss from signal transmission. The signals OT11 and OT12 are generated at final stage without passing through other electronic component, and thus the signal distortion is improved.

The AQEC 71 include two inverter chains 760 and 762, and each of the inverter chains 760 and 762 includes four inverters. For example, the inverter chain 760 can include four inverters 7601, 7602, 7603 and 7604. The inverter 7604 can be the last inverter of the inverter chain 760 to provide the signal OT1. The inverter 7603 can be formed as a previous stage of the inverter 7604. The inverter 7603 can be the second-to-last inverter of the inverter chain 760 for providing the signal OT1' to the inverter 7604. The signal OT1 can include an output clock signal, and the signal OT1' can include a pre-output clock signal. The signal OT1' can delay or advance half of period from the signal OT1.

In some embodiments, the signal OT1' can be transmitted to the LPF 130 of the ADCC 61. The signal OT1 can be transmitted to the LPF 130 of the ADCC 61, the PED 140 of the AQEC 62, and the signal divider 510. Because the signals OT1 and OT1' can be directly transmitted to the LPF 130 of the ADCC 61, the signal distortion can be reduced, and the phase accuracy is improved. Furthermore, the signal OT12 having phase of 180° is generated digitally to avoid IR drop or voltage loss to signal transmission. The signals OT11 and OT12 are generated at the final stage without passing through other electronic components and thus signal distortion is improved. In addition, since the FSM is not provided in the AQEC 71, the area of the semiconductor system 70A can be reduced.

Figure 7B:
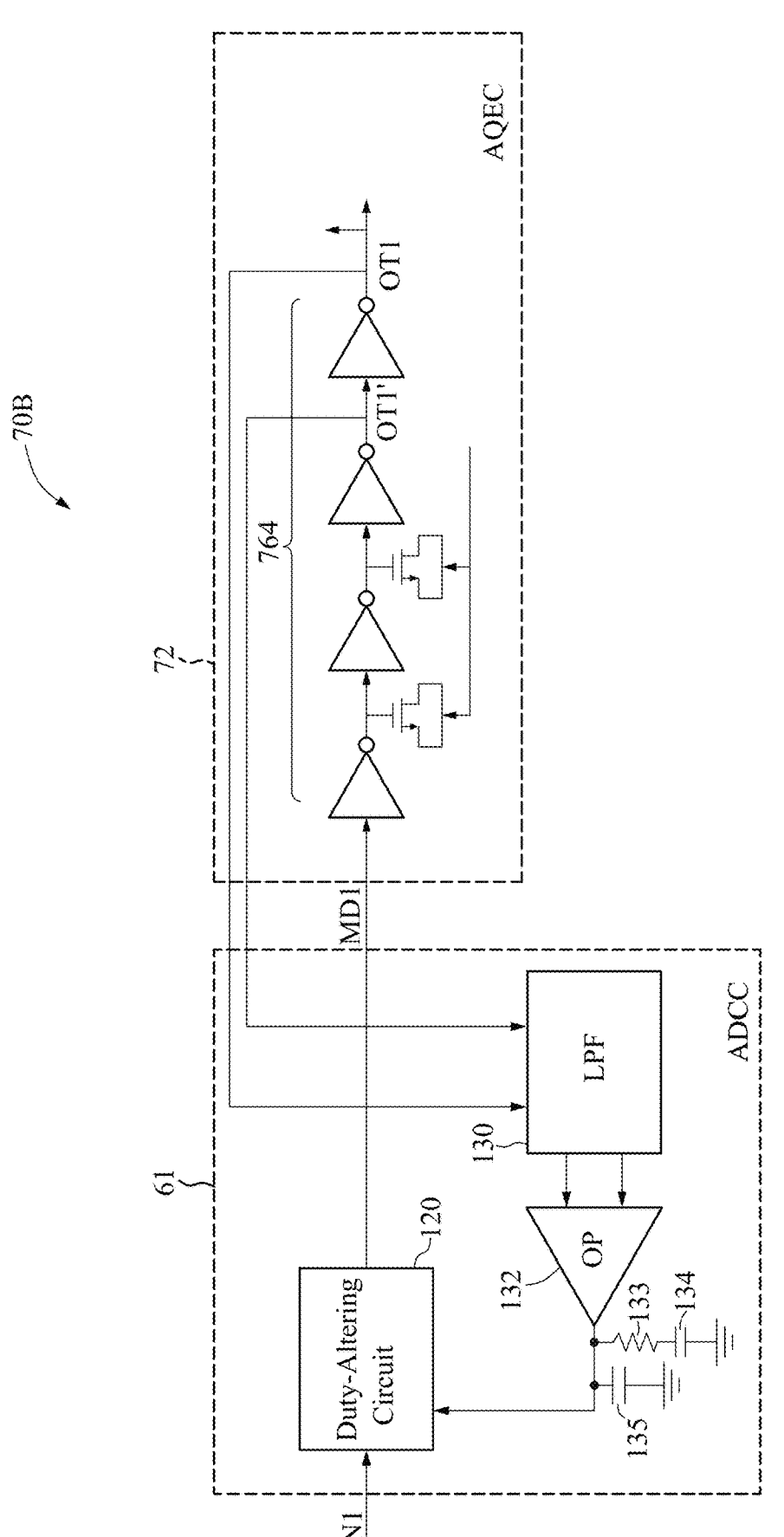
FIG. 7B is a schematic view of another semiconductor system having an ADCC and an AQEC, in accordance with some embodiments of the present disclosure.

FIG. 7B is a schematic view of another semiconductor system 70B having an ADCC 61 and an AQEC 72, in accordance with some embodiments of the present disclosure. The semiconductor system 70B of FIG. 7B is similar to the semiconductor system 70A of FIG. 7A, differing only as follows.

The semiconductor system 70B includes the ADCC 61 and the AQEC 72. The AQEC 72 of FIG. 7B is similar to the AQEC 71 of FIG. 7A, with the inverter chain 762, the PED 140, the LPF 150, and the OP 132 omitted. The AQEC 72 includes single inverter chain 764 for receiving the signal MD1 and generating the signal OT1. The semiconductor system 70B of FIG. 7B can correspond to a data lane for processing data signals. The semiconductor system 70A of FIG. 7A can correspond to a clock lane for processing clock signals.

Figure 8A:
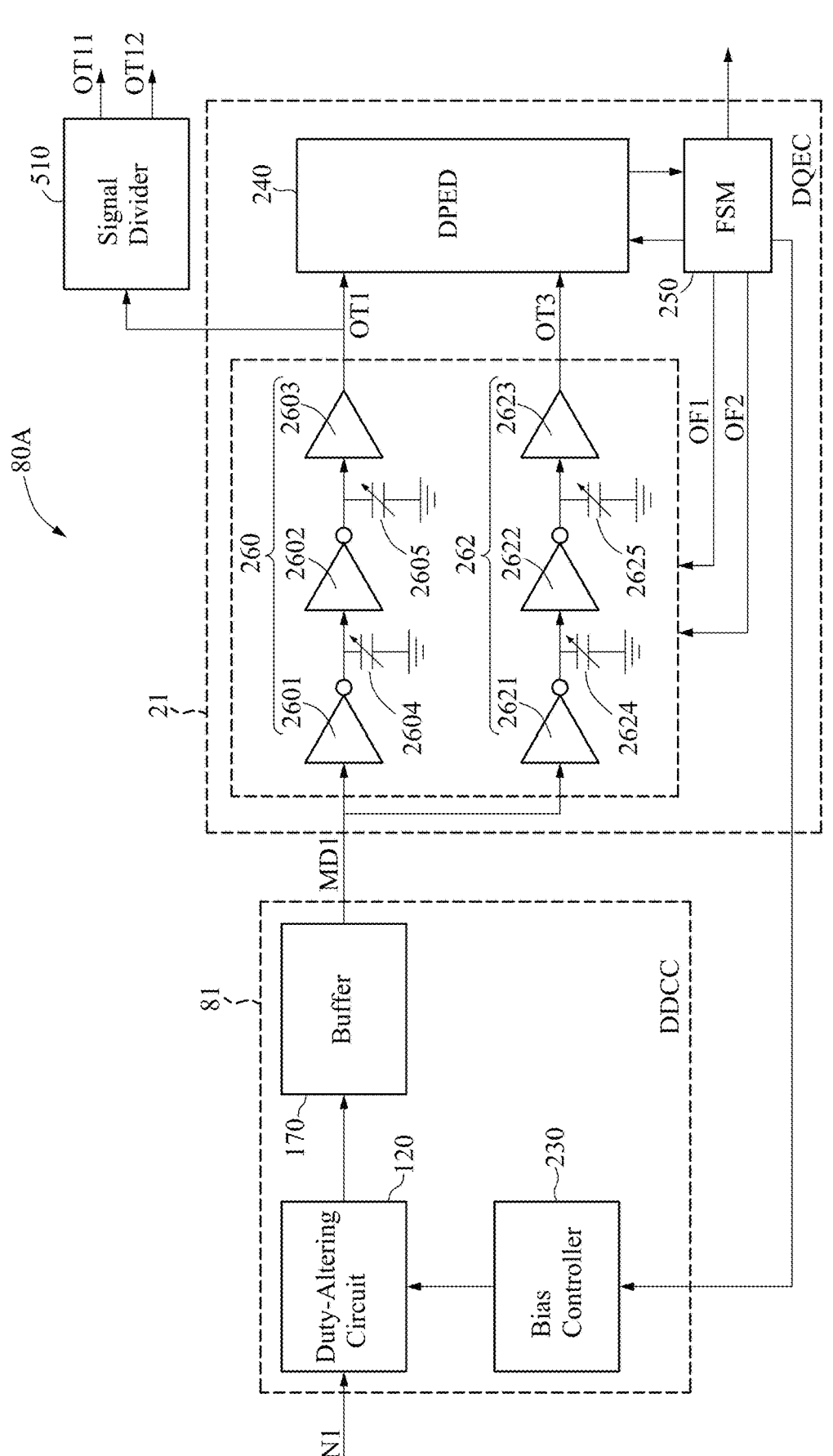
FIG. 8A is a schematic view of a semiconductor system having a DDCC and a DQEC, in accordance with some embodiments of the present disclosure.

FIG. 8A is a schematic view of a semiconductor system 80A having a DDCC 81 and a DQEC 21, in accordance with some embodiments of the present disclosure. The semiconductor system 80A of FIG. 8A is similar to the semiconductor system 30 of FIG. 3, differing only as follows.

The semiconductor system 80A includes the DDCC 81, the DQEC 21, and another signal divider 510. The signal divider 510 is similar to the signal divider 110 of FIG. 1A. The signal divider 510 can be electrically connected to the inverter chain 260 and the DPED 240 of the DQEC 21. The signal OT1 from the inverter chain 260 can be transmitted to both the DPED 240 and the signal divider 510. The signal divider 510 can be used to receive the signal OT1 and generate two signals OT11 and OT12 accordingly. The signals OT11 and OT12 can be fully differential. The signal OT11 can have phase of 0°, and the signal OT12 can have a phase of 180°. The signal OT12 having the phase of 180° is generated digitally to avoid IR drop or voltage loss from signal transmission. The signals OT11 and OT12 are generated at final stage without passing through other electronic components, and thus the signal distortion is improved.

Figure 8B:
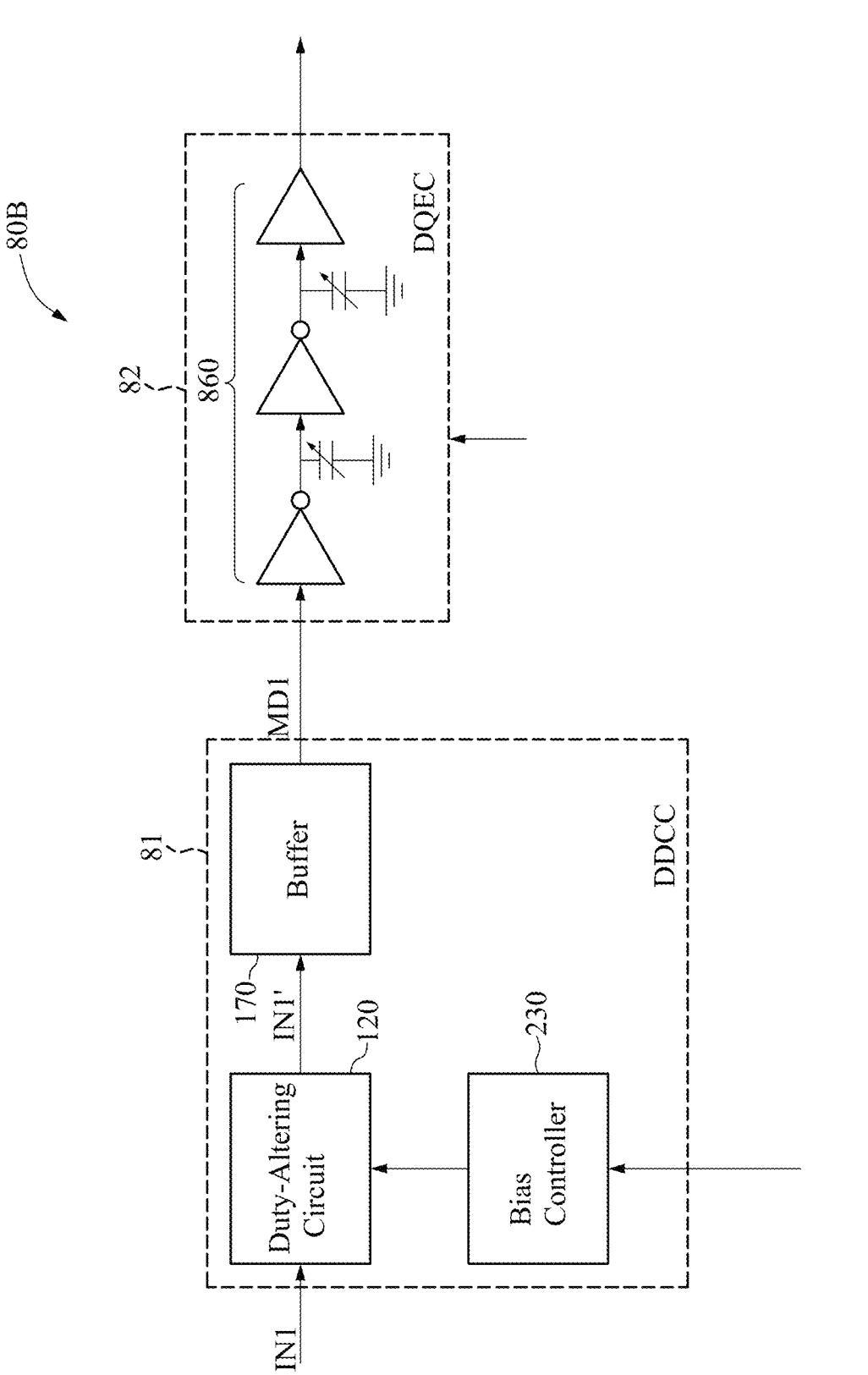
FIG. 8B is a schematic view of another semiconductor system having a DDCC and a DQEC, in accordance with some embodiments of the present disclosure.

FIG. 8B is a schematic view of another semiconductor system 80B having a DDCC 81 and a DQEC 82, in accordance with some embodiments of the present disclosure. The semiconductor system 80B of FIG. 8B is similar to the semiconductor system 80A of FIG. 8A, differing only as follows.

The semiconductor system 80B includes the DDCC 81 and the DQEC 82. The DQEC 82 of FIG. 8B is similar to the DQEC 21 of FIG. 8A, with the inverter chain 662, the DPED 240, and the FSM 250 omitted. The DQEC 82 includes single inverter chain 860 for receiving the signal MD1 and generating the signal OT1. The semiconductor system 80B of FIG. 8B can correspond to a data lane for processing data signals. The semiconductor system 80A of FIG. 8A can correspond to a clock lane for processing clock signals.

Figure 9:
FIG. 9 is a flowchart showing operation of a semiconductor system, in accordance with some embodiments of the present disclosure.
Figure 9:
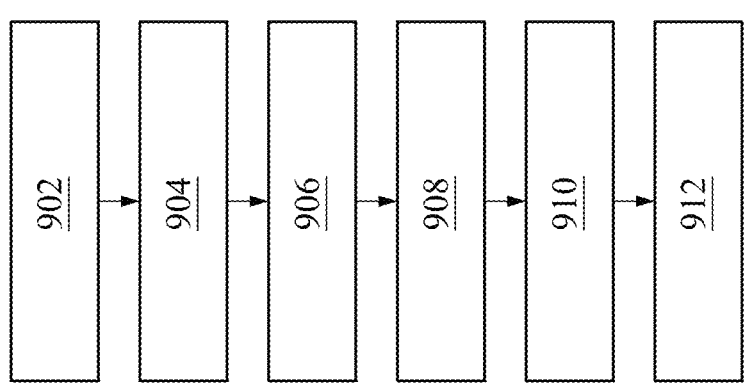

FIG. 9 is a flowchart 90 of operation of a semiconductor system, in accordance with some embodiments of the present disclosure. The flowchart 90 includes operations 902, 904, 906, 908, 910, and 912. In some embodiments, the flowchart 90 may include additional operations not depicted in FIG. 9. In operation 902, an input clock signal is received. In operation 904, a duty cycle of the input clock signal is adjusted to generate a first modified clock signal. In operation 906, the first modified clock signal is received. In operation 908, a delay of the first modified clock signal is generated to generate a first output clock signal and a second output clock signal. In operation 910, a quarter of period is delayed or advanced from the first output clock signal by the second output clock signal. In operation 912, the first output clock signal is received, and a phase of the first output clock signal is adjusted.

Some embodiments of the present disclosure provide a semiconductor system. The semiconductor system comprises a duty cycle corrector (DCC) and an analog quadrature error corrector (QEC). The DCC is configured to receive an input clock signal to adjust a duty cycle of the input clock signal and generate a first modified clock signal. The analog QEC is configured to receive the first modified clock signal. The analog QEC is configured to adjust a delay of the first modified clock signal and generate a first output clock signal and a second output clock signal. The second output clock signal delays or advances a quarter of period from the first output clock signal. The analog QEC comprises a first inverter chain, a phase error detector (PED) and a first low-pass filter (LPF). The first inverter chain comprises a plurality of inverters to receive the first modified clock signal and generate the first output clock signal. The PED is configured to receive the first output clock signal and adjust a phase of the first output clock signal. The first LPF is electrically connected to the PED and configured to filter the first output clock signal having the adjusted phase.

Some embodiments of the present disclosure provide a semiconductor system. The semiconductor system comprises a duty cycle corrector (DCC) and a digital quadrature error corrector (QEC). The DCC is configured to receive an input clock signal, and the DCC is configured to adjust a duty cycle of the input clock signal and generate a first modified clock signal. The digital QEC is configured to receive the first modified clock signal. The digital QEC is configured to adjust a delay of the first modified clock signal and generate a first output clock signal and a second output clock signal. The second output clock signal delays or advances a quarter of period from the first output clock signal. The digital QEC comprises a first inverter chain, a digital phase error detector, and a finite state machine (FSM). The first inverter chain includes a plurality of inverters to receive the first modified clock signal and generate the first output clock signal. The DPED is configured to receive the first output clock signal and adjust a phase of the first output clock signal. The FSM is electrically connected to the DPED and configured to receive the first output clock signal with adjusted phase.

Some embodiments of the present disclosure provide a method for operating a semiconductor system. The method includes receiving an input clock signal, adjusting a duty cycle of the input clock signal to generate a first modified clock signal, receiving the first modified clock signal, adjusting a delay of the first modified clock signal to generate a first output clock signal and a second output clock signal, and receiving the first output clock signal and adjusting a phase of the first output clock signal.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:

1. A semiconductor system, comprising:
a duty cycle corrector (DCC) configured to receive an input clock signal, wherein the DCC is configured to adjust a duty cycle of the input clock signal and generate a first modified clock signal; and
an analog quadrature error corrector (analog QEC) configured to receive the first modified clock signal, wherein the analog QEC is configured to adjust a delay of the first modified clock signal and generate a first output clock signal and a second output clock signal, and the second output clock signal delays or advances a quarter of period from the first output clock signal, wherein the analog QEC comprises:
a first inverter chain comprising a plurality of inverters, configured to receive the first modified clock signal and generate the first output clock signal;
a phase error detector (PED) configured to receive the first output clock signal and perform XOR operation and XNOR operation on the first output clock signal to adjust a phase of the first output clock signal; and
a first low-pass filter (LPF) electrically connected to the PED and configured to receive and filter the first output clock signal having the adjusted phase.

2. The semiconductor system of claim 1, wherein the analog QEC further comprises:
a second inverter chain comprising a plurality of inverters, configured to receive the first modified clock signal and generate the second output clock signal; and
a first operational amplifier (OP), electrically connected between the first LPF and the second inverter chain.

3. The semiconductor system of claim 2, wherein the first inverter chain further comprises a plurality of first transistors, each of the first transistors is electrically coupled between two adjacent inverters of the first inverter chain, and the first transistors are operable in response to a reference voltage.

4. The semiconductor system of claim 3, wherein the second inverter chain further comprises a plurality of second transistors, each of the plurality of second transistors is electrically coupled between two adjacent inverters of the second inverter chain, and the second transistors are operable in response to an output voltage of the first OP.

5. The semiconductor system of claim 1, wherein the DCC further comprises:
a duty-altering circuit configured to alter the duty cycle of the input clock signal;
a second operational amplifier (OP) electrically connected to the duty-altering circuit; and
a second low-pass filter (LPF) electrically connected to the second OP.

6. The semiconductor system of claim 5, wherein the DCC is an analog DCC, the first output clock signal output by a last inverter of the first inverter chain is configured to be transmitted to the second LPF, a pre-output clock signal output by a second-to-last inverter of the first inverter chain is configured to be transmitted to the second LPF, the second-to-last inverter is a previous stage of the last inverter, and the pre-output clock signal delays or advances half of period from the first output clock signal.

7. The semiconductor system of claim 6, further comprising a first signal divider configured to receive the first output clock signal and generate two additional output signals, wherein one of the additional output signals delays or advances half of period from the other of the additional output signals.

8. The semiconductor system of claim 5, wherein the DCC is an analog DCC, and the analog DCC further comprises a second signal divider electrically connected between the duty-altering circuit and the second LPF, the second signal divider is configured to receive the input clock signal with altered duty cycle from the duty-altering circuit and generate the first modified clock signal and a second modified clock signal, wherein the second modified clock signal delays or advances half of period from the first modified clock signal.

9. A semiconductor system, comprising:

a duty cycle corrector (DCC) configured to receive an input clock signal, wherein the DCC is configured to adjust a duty cycle of the input clock signal and generate a first modified clock signal; and a digital quadrature error corrector (digital QEC) configured to receive the first modified clock signal, wherein the digital QEC is configured to adjust a delay of the first modified clock signal and generate a first output clock signal and a second output clock signal, and the second output clock signal delays or advances a quarter of period from the first output clock signal, wherein the digital QEC comprises:

a first inverter chain comprising a plurality of inverters, configured to receive the first modified clock signal and generate the first output clock signal;

a digital phase error detector (DPED) configured to receive the first output clock signal and perform XOR operation and XNOR operation on the first output clock signal to adjust a phase of the first output clock signal; and a finite state machine (FSM) electrically connected to the DPED and configured to receive the first output clock signal having the adjusted phase.

10. The semiconductor system of claim 9, wherein the digital QEC further comprises a second inverter chain comprising a plurality of inverters, configured to receive the first modified clock signal and generate the second output clock signal.

11. The semiconductor system of claim 10, wherein the first inverter chain further comprises a plurality of first capacitors, each of the first capacitors is electrically coupled between two adjacent inverters of the first inverter chain.

12. The semiconductor system of claim 11, wherein second inverter chain further comprises a plurality of second capacitors, each of the plurality of second capacitors is electrically coupled between two adjacent inverters of the second inverter chain.

13. The semiconductor system of claim 11, wherein the DCC further comprises:

a duty-altering circuit configured to alter the duty cycle of the input clock signal;

an operational amplifier (OP) electrically connected to the duty-altering circuit; and a low-pass filter (LPF) electrically connected to the OP.

14. The semiconductor system of claim 13, wherein the DCC is an analog DCC, the first output clock signal output by a last inverter of the first inverter chain is configured to be transmitted to the LPF.

15. The semiconductor system of claim 14, wherein a pre-output clock signal output by a second-to-last inverter of the first inverter chain is configured to be transmitted to the LPF, the second-to-last inverter is a previous stage of the last inverter, and the pre-output clock signal delays or advances half of period from the first output clock signal.

16. The semiconductor system of claim 15, further comprising a first signal divider configured to receive the first output clock signal and generate two additional output signals, wherein one of the additional output signals delays or advances half of period from the other of the additional output signals.

17. The semiconductor system of claim 14, wherein the DCC is an digital DCC, and the digital DCC comprises:

the duty-altering circuit configured to alter the duty cycle of the input clock signal; and a second signal divider configured to receive the input clock signal with altered duty cycle and generate the first modified clock signal and a second modified clock signal, wherein second modified clock signal delays or advances half of period from the first modified clock signal.

18. The semiconductor system of claim 13, wherein the DCC is an analog DCC, the analog DCC further comprises a buffering circuit electrically connected to the duty-altering circuit, and the buffering circuit is configured to receive the input clock signal with altered duty cycle and generate the first modified clock signal.

19. A method for operating a semiconductor system, comprising:

receiving an input clock signal;

adjusting a duty cycle of the input clock signal to generate a first modified clock signal;

receiving the first modified clock signal;

adjusting a delay of the first modified clock signal to generate a first output clock signal and a second output clock signal;

delaying or advancing a quarter of period from the first output clock signal by the second output clock signal; and receiving the first output clock signal and adjusting a phase of the first output clock signal.

20. The method of claim 19, further comprising performing XOR operation and XNOR operation on the first output clock signal to adjust the phase of the first output clock signal.

* * * * *